US006736268B2

(12) United States Patent
Nyseth et al.

(10) Patent No.: US 6,736,268 B2
(45) Date of Patent: May 18, 2004

(54) TRANSPORT MODULE

(75) Inventors: David L. Nyseth, Plymouth, MN (US); Dennis J. Krampotich, Shakopee, MN (US); Todd M. Ulschmid, New Prague, MN (US); Gregory W. Bores, Prior Lake, MN (US)

(73) Assignee: Entegris, Inc., Chaska, MN (US)

( * ) Notice: Subject to any disclaimer, the term of this patent is extended or adjusted under 35 U.S.C. 154(b) by 71 days.

(21) Appl. No.: 10/013,305

(22) Filed: Nov. 13, 2001

(65) Prior Publication Data
US 2002/0125170 A1 Sep. 12, 2002

Related U.S. Application Data

(63) Continuation-in-part of application No. 09/476,546, filed on Jan. 3, 2000, now abandoned, which is a continuation of application No. 08/891,644, filed on Jul. 11, 1997, now Pat. No. 6,010,008.

(51) Int. Cl.[7] ................................................ B65D 85/90
(52) U.S. Cl. ........................................ 206/711; 206/454
(58) Field of Search .............................. 206/213.1, 445, 206/454, 701, 710–712, 832, 833; 211/41.18; 141/98; 414/217, 416; 438/800

(56) References Cited

U.S. PATENT DOCUMENTS

| 324,671 | A | | 8/1885 | Drake |
|---|---|---|---|---|
| 4,532,970 | A | | 8/1985 | Tullis et al. |
| 4,676,709 | A | | 6/1987 | Bonora et al. |
| 4,739,882 | A | | 4/1988 | Parikh et al. |
| 4,815,912 | A | | 3/1989 | Maney et al. |
| 4,995,430 | A | | 2/1991 | Bonora et al. |
| 5,024,329 | A | | 6/1991 | Grohrock |
| 5,445,271 | A | | 8/1995 | Kakizaki et al. |
| 5,452,795 | A | | 9/1995 | Gallagher et al. |
| 5,469,963 | A | | 11/1995 | Bonora et al. |
| 5,472,086 | A | | 12/1995 | Holliday et al. |
| 5,482,161 | A | | 1/1996 | Williams et al. |
| 5,570,987 | A | | 11/1996 | McKenna |
| D378,873 | S | | 4/1997 | Gregerson et al. |
| 5,944,194 | A | | 8/1999 | Gregerson et al. |
| 6,000,732 | A | | 12/1999 | Scheler et al. |
| 6,006,919 | A | * | 12/1999 | Betsuyaku ................... 206/711 |
| 6,010,008 | A | * | 1/2000 | Nyseth et al. ............... 206/711 |
| 6,082,540 | A | * | 7/2000 | Krampotich et al. ........ 206/445 |
| 6,267,245 | B1 | * | 7/2001 | Bores et al. ................. 206/711 |
| 6,273,261 | B1 | * | 8/2001 | Hosoi .......................... 206/711 |
| 6,382,419 | B1 | * | 5/2002 | Fujimori et al. ............ 206/454 |
| 6,398,032 | B2 | * | 6/2002 | Fosnight et al. ............ 206/711 |
| 6,432,849 | B1 | * | 8/2002 | Endo et al. .................. 438/800 |
| 2002/0020650 | A1 | * | 2/2002 | Fujimori et al. ............ 206/454 |
| 2003/0047476 | A1 | * | 3/2003 | Wu et al. ..................... 206/454 |

FOREIGN PATENT DOCUMENTS

| EP | 0579099 | 7/1993 |
|---|---|---|
| EP | 0744765 | 5/1996 |
| NL | 1006529 | 7/1997 |
| WO | 97/13710 | 4/1997 |

* cited by examiner

*Primary Examiner*—Jim Foster
(74) *Attorney, Agent, or Firm*—Patterson, Thuente, Skaar & Christensen, P.A.

(57) ABSTRACT

A front-opening wafer transport module has a container portion with transparent shell and a central support structure which includes a machine interface exposed at the bottom of the module and integral wafer support columns extending upwardly in the container portion for supporting wafers. Additionally, the side walls of the shell have recessed portions with engagement members that cooperate with engagement members on removable handles. The handles utilize detents to lock into place in the recesses on the side walls of the carrier. Attachment of the handles to the side walls is accomplished without breaks between the interior and exterior of the module and without separate fastners.

21 Claims, 9 Drawing Sheets

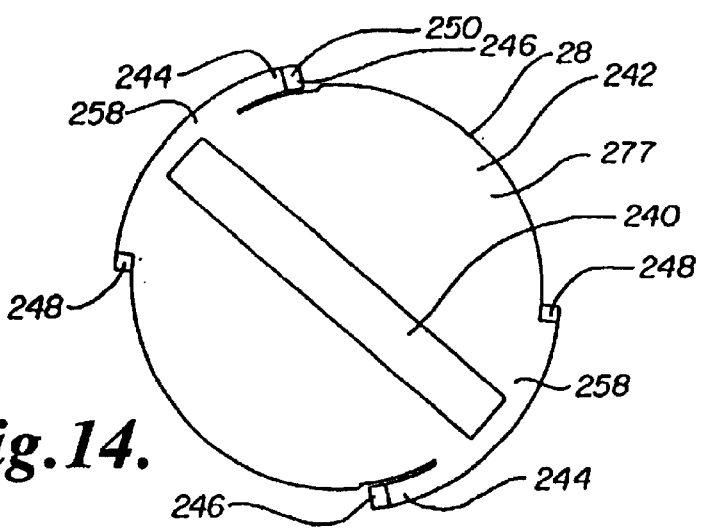
*Fig. 14.*
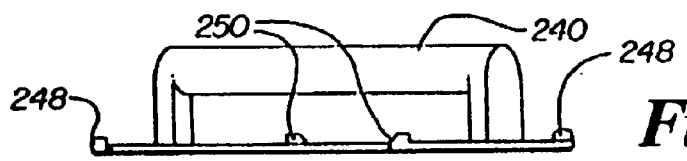
*Fig. 15.*
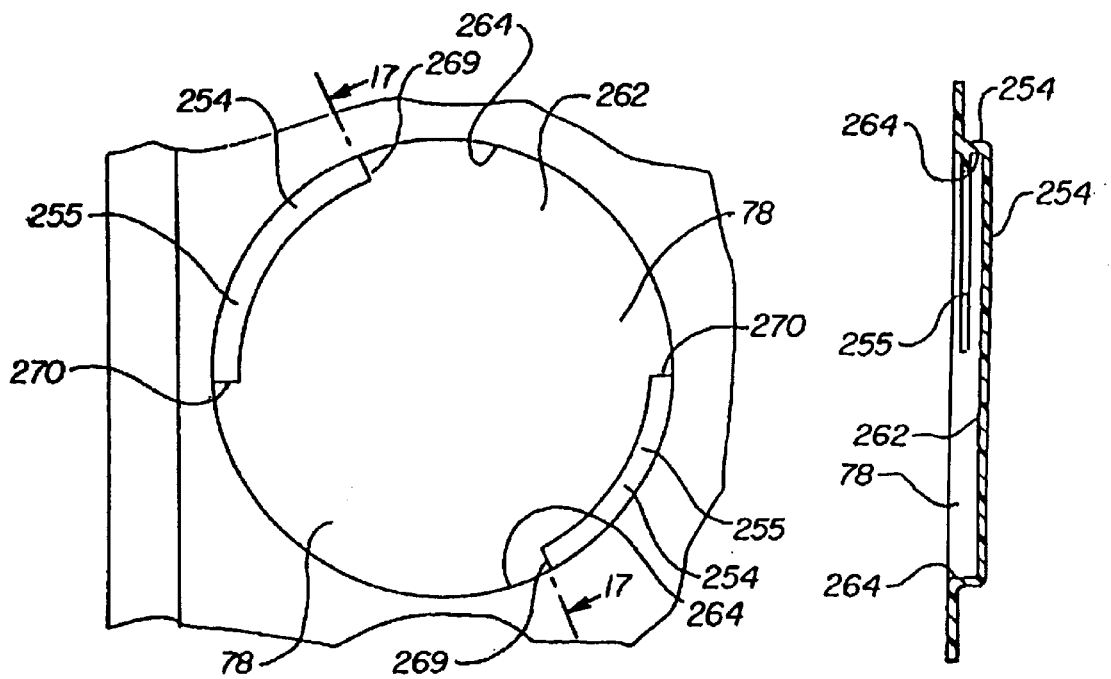
*Fig. 16.*  *Fig. 17.*

TRANSPORT MODULE

This application is a Continuation-in-Part of application Ser. No. 09/476,546, filed Jan. 3, 2000, now abandoned, which is a Continuation of application Ser. No. 08/891,644, filed Jul. 11, 1997 issued as U.S. Pat. No. 6,010,008 which are hereby incorporated herein by reference in their entirety.

BACKGROUND OF THE INVENTION

This invention relates to carriers for semiconductor wafers and more particularly it relates to a closeable container for storing and transporting wafers.

Sealable enclosures, generally termed transport modules, have been utilized in the semiconductor processing industry for a number of years for storing and transporting wafers between processing steps and/or between facilities. Semiconductor wafers are notoriously vulnerable to damage from contaminants such as particles. Extraordinary measures are taken to eliminate contaminants in cleanrooms and other environments where semiconductor wafers are stored or processed into circuits.

For wafers in the range of 200 mm and smaller, containers known as SMIF pods (standardized mechanism interface) have been utilized to provide a clean sealed mini-environment. Examples of these pods are shown in U.S. Pat. Nos. 4,532,970 and 4,534,389. Such SMIF pods typically utilize a transparent box-shaped shell with a lower door frame or flange defining an open bottom and a latchable door. The door frame clamps onto processing equipment and a door on the processing equipment and the lower SMIF pod door closing the open bottom are simultaneously lowered downwardly from the shell into a sealed processing environment in said processing equipment. A separate H-bar carrier positioned on the top surface inside of the SMIF pod door and loaded with wafers is lowered with the pod door for accessing and processing said wafers. In such pods the weight of the wafers would be directly on the door during storage and transport.

The semiconductor processing industry is moving toward utilization of larger and heavier wafers, specifically 300 mm wafers. Transport modules for such modules, by way of developing industry standards, will utilize a front opening door for insertion and removal of the wafers as opposed to a bottom door that drops downwardly from the module. The door would not support the load of the wafers, rather a container portion which would include a clear plastic (such as polycarbonate) shell and other members or supporting the wafers molded from a low particle generating plastic (such as polyetheretherketone) would carry the load of the wafers. Such container portions necessarily are made from multiple components assembled together.

In handling and processing semiconductor wafers, static electricity is a continuing concern. Electrostatic discharges can damage or ruin semiconductor wafers. Therefore, means must be taken to minimize any such generation of potentials which may cause static electric discharges. H-bar carriers have been manufactured with convention static dissipative materials such as carbon filled polyetheretherketone (PEEK) and polycarbonate (PC).

The developing industry standards for such 300 mm modules require a machine interface, such as a kinematic coupling, on the bottom of the module to repeatedly and with precision align the module with respect to the processing equipment. This allows robotic handling means to engage the door on the front side of the module, open the door, and with the necessary amount of precision grasp and remove specific horizontally arranged wafers. It is highly critical to have the wafers positioned at a particular height and orientation with reference to the equipment machine interface such that the wafers will not be located and damaged during the robotic withdrawal and insertion of said wafers.

Due to inconsistencies in molding plastic parts assembly of such plastic parts lead to inconsistencies, such as open cracks between parts and the stacking of the tolerances of each individual part leading to undesirable variations in critical dimensions.

Known front opening 300 mm transport modules utilize multiple component parts including multiple components between the equipment interface and the wafer supports. This can lead to difficulty in producing modules with acceptable tolerances between the wafer planes and the equipment interface. Additionally, such modules have a path to ground from the wafer shelves to the equipment interface through several different components including metallic screws.

The 300 mm wafers are substantially greater in size and weight than the 200 mm modules; therefore, a structurally stronger module for transporting batches of wafers is required. Typically with the 200 mm SMIF pods the module was simply carried manually by grasping the lower edges at the juncture of the shell door flange and the door. Handles have been provided on the top of the shell portion for bottom opening pods. For carrying the larger, heavier, and bulkier modules for 300 mm wafers side handles are appropriate. For certain applications, the movement of the 300 mm module may be exclusively by way of robotic means thus not requiring handles or other means for manually transporting the container. Thus, a robotic lifting handle should be provided and any manual lifting handles should be easily removable.

Additionally, due to the high susceptibility of wafers to contamination by particles, moisture or other contaminants it is ideal to have a minimal number of potential entry paths to the interior of the module. Paths or breaks in the plastic between the interior and exterior of the pod such as for fasteners or at the junction of separate component parts of the module are to be avoided. Any such path required should be adequately sealed.

Additionally, the use at any location in the pod of metallic fasteners or other metal parts are highly undesirable in semiconductor wafer carriers or containers. Metallic parts generate highly damaging particulates when rubbed or scrapped.

SUMMARY OF THE INVENTION

A front-opening wafer transport module has a container portion with transparent shell and a central support structure which includes a machine interface exposed at the bottom of the module and integral wafer support columns extending upwardly in the container portion for supporting wafers. Additionally, the side walls of the shell have recessed portions with engagement members that cooperate with engagement members on removable handles. The handles utilize detents to lock into place in the recesses on the side walls of the carrier. Attachment of the handles to the side walls is accomplished without breaks between the interior and exterior of the module and without separate fastners.

A feature and advantage of the invention is that there are no stacking of tolerances among parts relative to the machine interface level and the levels of the wafers on the wafer shelves. Where multiple components define the machine interface level and the wafer levels, each part has a separate manufacturing tolerance and when such components are assembled into the module the tolerances are cumulative. This translates into a higher rejection of individual parts and/or a higher rejection level of assembled modules. The instant invention utilizes a single integral component for the machine interface and the wafer support members.

Another advantage and feature of the invention is that a non-interrupted path-to-ground extends from each wafer support shelf to the machine interface.

Another object and advantage of the invention is that the central support structure which holds the wafers is assembled into the shell through a lower opening and is secured in place by a rotation of the central support structure with respect to the shell. No metallic fasteners are used.

Additionally, the central support structure engages and locks at the top of the shell by way of a top portion with a collar that extends into an aperture in the top of the shell and robotic lifting flange that slidably engages the top portion of the central support structure and also thereby non-rotatably locks the support structure to the shell. Again, no metallic fasteners or components are used.

Another object and advantage of the invention is that the breaks or openings in the module between the interior and exterior are sealed such as by elastomeric seals. The breaks or openings other than at the front door are circular in shape and are sealed such as by O-rings.

Anther object and advantage of the invention is that handles may be easily added and removed to the module without utilizing metallic fasteners or other separate fasteners and without breaks or openings in the solid side walls.

Another object and advantage of the invention is that the component parts may be easily disassembled for cleaning and/or replacement for maintenance.

BRIEF DESCRIPTION OF THE DRAWINGS

FIG. 14 is a front elevational view of the handle.

FIG. 15 is a side elevational view of the handle.

FIG. 16 is a side elevational view of a portion of the shell showing the recess for the handle.

FIG. 17 is a cross-sectional view taken at line 17—17 of FIG. 6.

DETAILED SPECIFICATION

Figure 1:
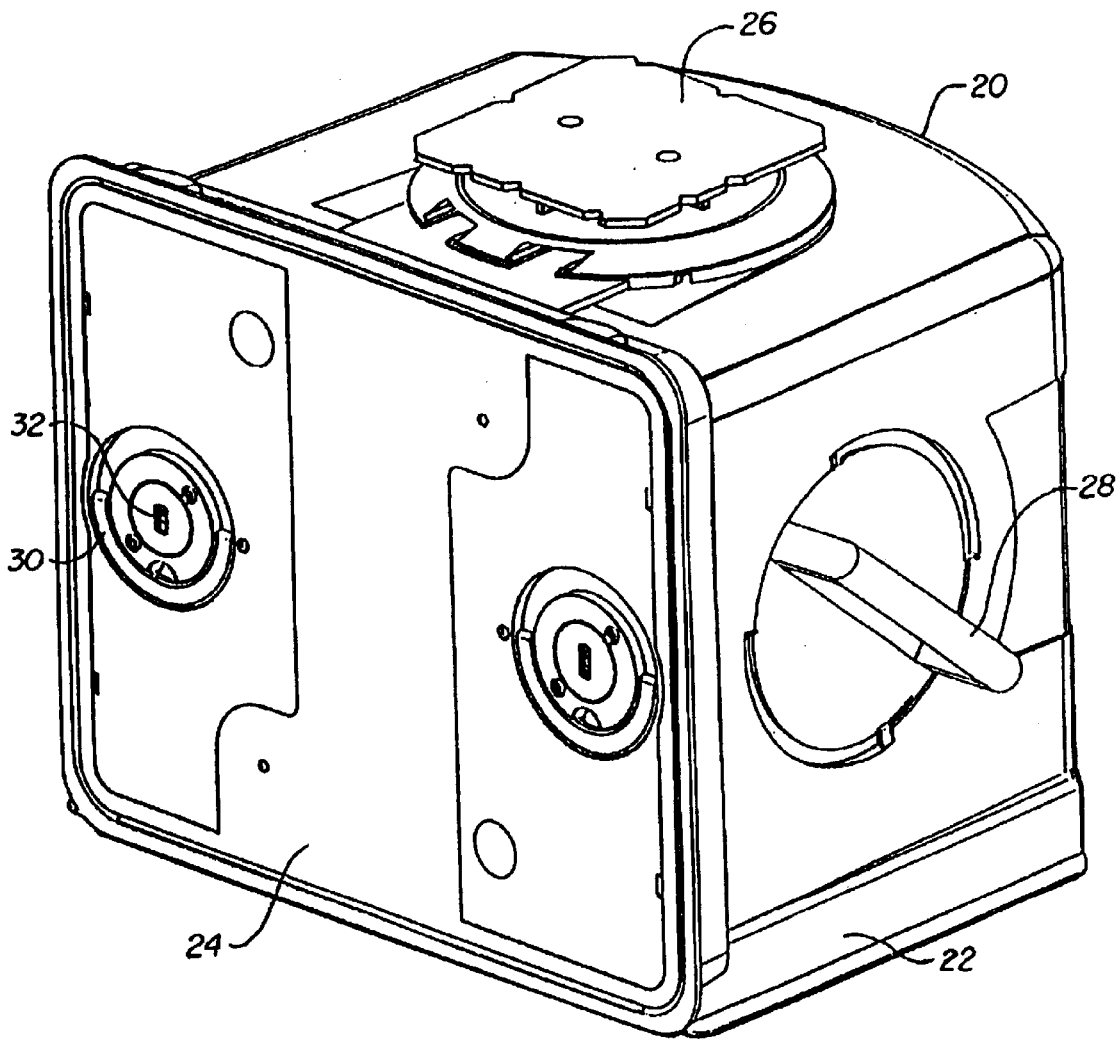
FIG. 1 is a perspective view of a transport module plotting the invention.
Figure 2:
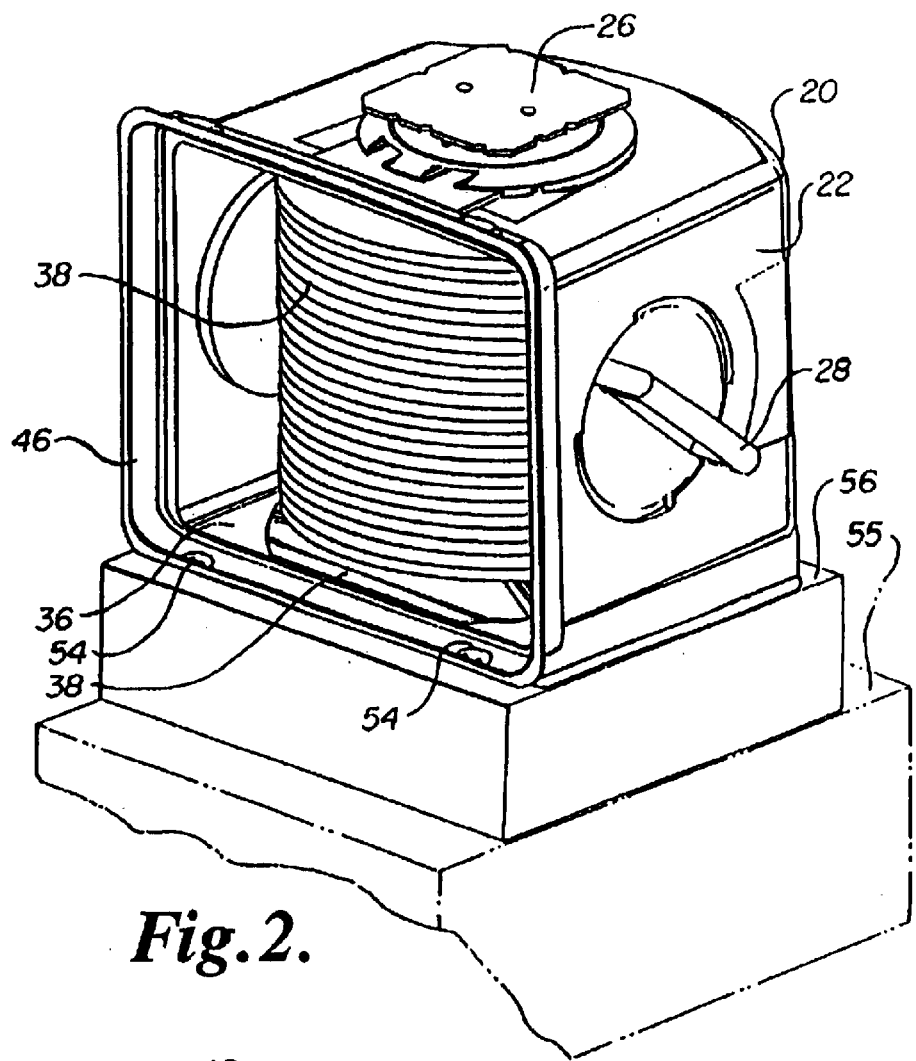
FIG. 2 is a perspective view of the container portion of a transport module embodying the invention.
Figure 3:
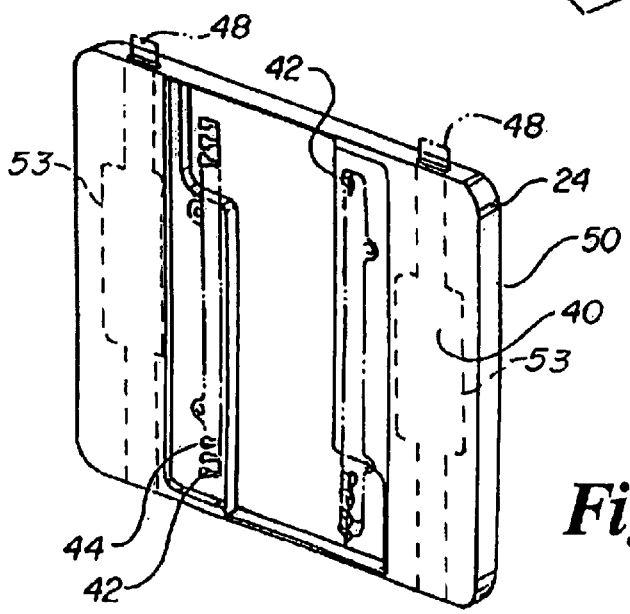
FIG. 3 is a perspective view of the inside facing cover of the door for the transport module embodying the invention.

Referring to FIGS. 1, 2, and 3 a composite transport module for wafers generally designated with the numeral 20 is principally comprised of a container portion 22 and a door 24. The container portion includes a robotic lifting flange 26 and manual lifting handles 28. The door 24 has manual opening handles 30 and a key slot 32 which provides capability of being opened by way of robotic means. FIG. 2 shows the container portion and its open interior 36 with a plurality of wafers 38 shown supported and axially arranged in said open interior. FIG. 3 shows the inside surface 40 of the door. The door has a pair of wafer restraints 42 which engage and restrain the wafers when the door is in place. The wafer retainers are formed of flexible teeth 44 which are of resilient molded plastic. The door 24 fits within a door flange 46 on the container portion 22 and utilizes latches 48 which extend and retract from the door enclosure 50 to engage recesses 54 in the door flange. The door has a pair of internal latch mechanisms 53 which operate independently of each other and by way of the manual door handle 30 or key slot 32. FIG. 3 also depicts a piece of processing equipment 55 with a module interface portion 56 on which the transport module 20 is engaged.

Figure 4:
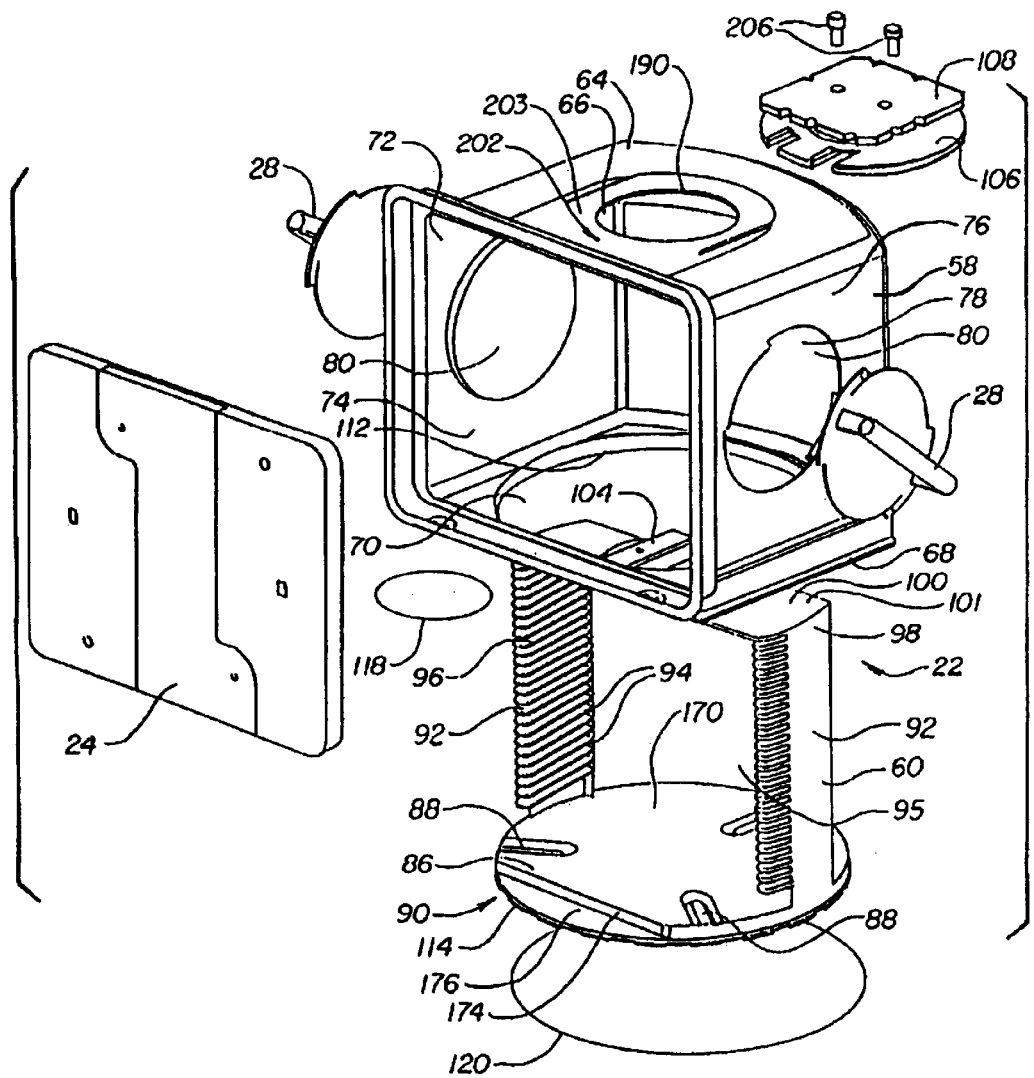
FIG. 4 is an exploded view showing the various component parts of a transport module.

Referring to FIG. 4, an exploded perspective view of the transport module which show details of the construction and the various component parts. The container portion 22 is comprised principally of a shell 58 and a central support structure 60.

The shell 58 has a top 64 with an aperture 66, a bottom 68 with a lower opening 70, an open front side 72, a left side wall 74, and a right side wall 76 both with handle receiving portions configured as recesses 78 extending inwardly. Notably, the recesses project into the interior but have no cracks, breaks, openings or apertures between the interior 74 and the exterior of the container. The side walls may be continuous and solid. The handle receiving portions include a recessed planar portion 80 which is part of the side walls. Shelves may be as shown in U.S. patent application Ser. No. 09/523,745 to David Nyseth filed Mar. 13, 2000. Said application is hereby incorporated by reference.

The central support structure 60 is comprised of a bottom portion with an equipment interface 86 configured as a plate with three interface structures 88 which comprise a kinematic coupling. Integral with the machine interface portion 86 are a pair of wafer support columns 92 each of which comprise a plurality of shelves 94 and defining a wafer receiving region 95. Each shelf having wafer engagement portions 96. The wafer support columns 92 are integral with a top portion 100 which includes a spanning member 101 which extends between the tops 98 of the support columns 92 and also includes a first connecting member 104.

Figure 5:
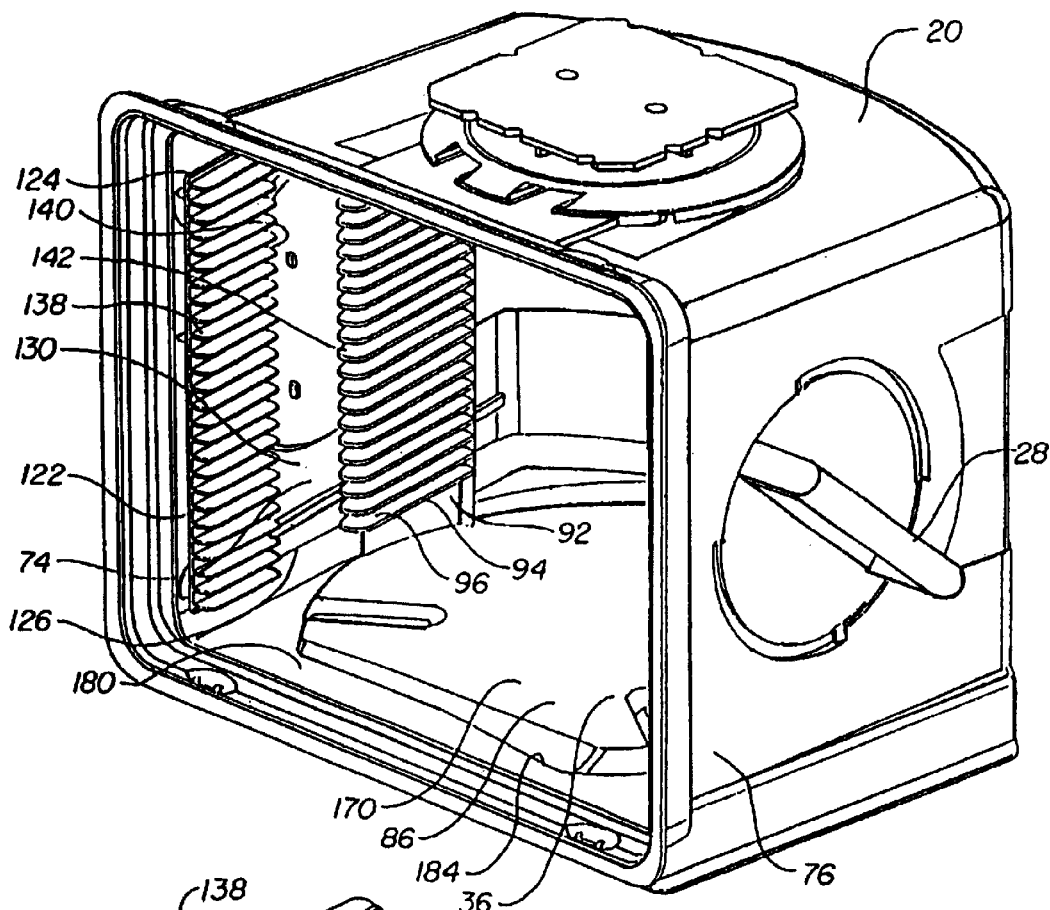
FIG. 5 is a perspective view of a container portion of the transport module.
Figure 6:
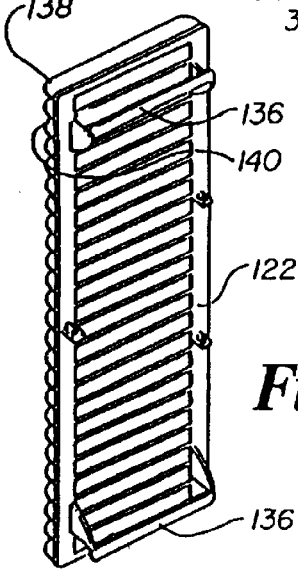
FIG. 6 is a perspective view of a guide-in structure.
Figure 7:
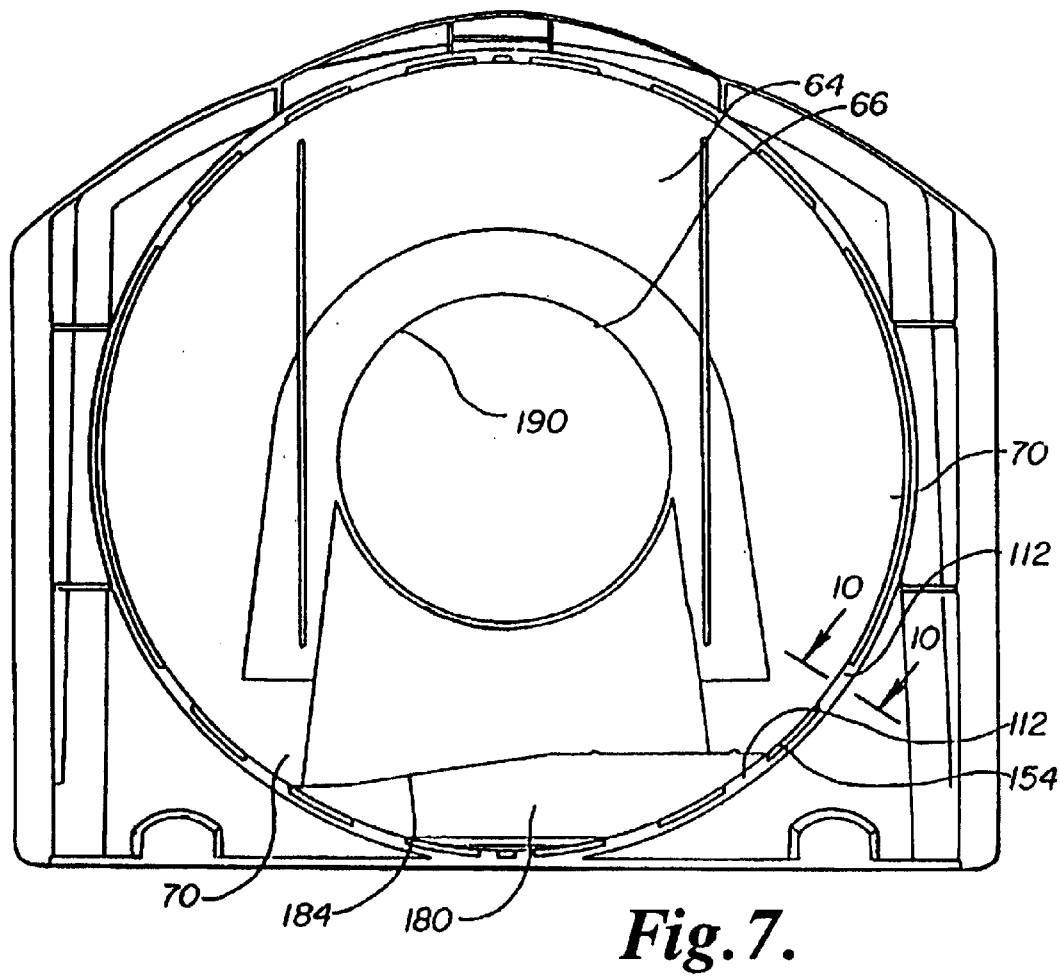
FIG. 7 is a bottom view of the shell of the container portion.
Figure 10:
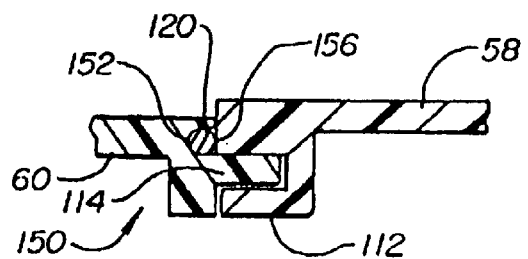
FIG. 10 is a cross-sectional view taken at line 10—10 of FIG. 7.

The central support structure 60 assembles upwardly into the lower opening 70 of the shell 58 with the first connecting member extending upwardly through the aperture 66 on the top 64 of the shell 58. The second connecting member 106 slidably engages on the first connecting member 104 for retention of the central support structure in the shell. A second connecting member 106 which is integral with a robotic lifting handle 108 configured as a flange. The shell also includes first engagement members 112 as part of a support structure engagement portion 113 which engage with second engagement members 114 as part of a shell engagement portion 115 on the central support structure. These cooperating engagement members also secure the central support structure to and within the shell. A first O-ring 118 engages between the top portion 100 of the central support structure and the top 64 of the shell to create a seal thereabout. Similarly, a second O-ring 120 seals between the machine interface portion 86 and the bottom 68 of the shell. Referring to FIG. 5, the transport module 20 with the door 24 removed reveals the open interior 36 and the various interior structures. This particular embodiment utilizes a guide-in structure 122 which engages with rails 124, 126 on the interior surface 130 of the side walls 74, 76 and integral with same. Shown in FIG. 6 each guide-in structure utilizes elongate engagement members 136 to fit within the rails 124, 126, the guide-in structure 122 includes teeth 138 which define slots 140 which are substantially parallel to and correlate with each of the slots 142 as defined by the shelves 94 of said wafer support columns 92. Typically the guide-in members are intended to be used when there is manual insertion of the wafers as opposed to robotic insertion. The guide-in structures 122 can also be expanded to support each wafer during more of each wafer's travel into and out of the transport module.

Figure 8:
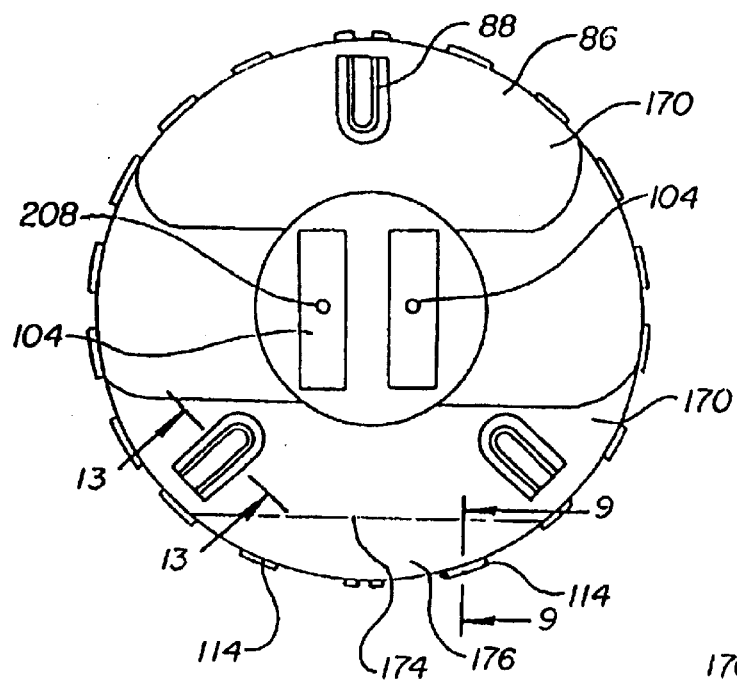
FIG. 8 is a top plan view of the central support structure.

As shown best in FIGS. 4, 5 and 8, the lower portion of the central support structure includes a machine interface plate 86 which has a planar top surface 170 and a step 174 down to a lower planar surface 176. Note that the lower planar surface 176 confronts the inwardly-extending portion 180 of the bottom 68 of the shell 58. Note that this inwardly-extending portion 180 does not extend uniformly as a chord across the lower generally circular opening 70; rather a further inset portion 184 allows the central support structure 60 to be put in place slightly rotated off the fully aligned position to provide for the insertion of the second engagement members into position intermediate the first engagement member 112 on the shelf. The central support structure 60 can then be partially rotated to the assembled position as shown in FIG. 5.

Figure 11:
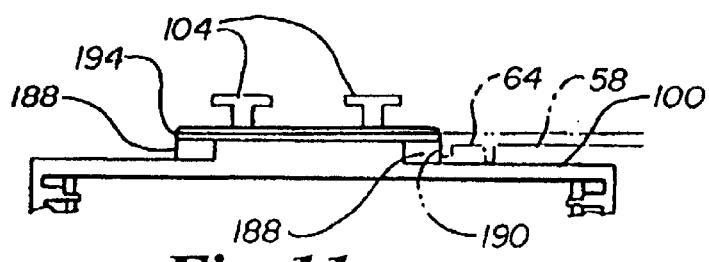
FIG. 11 is a front elevational view of the top portion of the central support structure.
Figure 12:
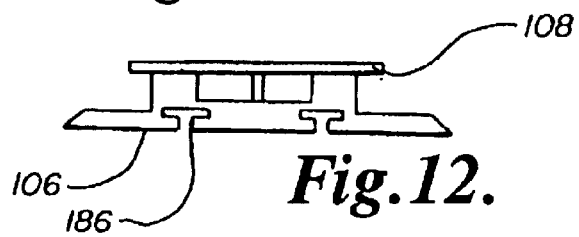
FIG. 12 is a front elevational view of the second connecting member including the robotic flange.

Referring to FIGS. 4, 8, 11 and 12, details of the elements and components which comprise the connection between the top portion 100 of the central support structure 60 and the shell 58 are shown in detail. The top portion 100 has a pair of first connecting members 104 which have a generally T-shaped cross section as best shown in FIG. 11. The first connecting members 104 engage with and fit into slots 186 also having a T-shaped cross section in the second connecting member 106 which is part of the robotic lifting flange 108. After the central support structure 60 is inserted into place in the shell 58 and rotated to the proper alignment position, the collar or neck 188 of the top portion 100 will extend through the aperture 66 and will confront the inner edge 190 which defines said aperture. The smaller O-ring 118 fits into the O-ring groove 194 on said neck 188 and creates a seal with the shell at the inner edge 190. The phantom line of FIG. 11 shows the relationship of the top 64 of the shell 58 as it confronts the neck 188 of the top portion of the central support structure 60. Thus, when the second connecting member 106 is engaged with the first connecting members 104, the top 64 of the shell 58 is sandwiched between said first engagement member 106 and the top portion 100 of the central support structure. The second connecting member 106 may be locked in place on the first connecting member 104 by way of an appropriately positioned detent or nub 202 such as shown in FIG. 4 on the top surface 203 of the top of the shell 58. Alternatively or additionally, screws 206 may be utilized which would extend through the robotic pick-up flange 108 through the second connecting member 106 and into the threaded holes 208 in the first connecting members 106. The screws are appropriately nylon as opposed to a metallic material.

Figure 13:
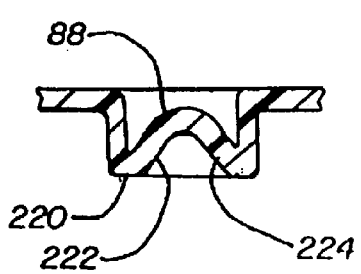
FIG. 13 is a cross-sectional view taken at line 13—13 of FIG. 8.
Figure 9:
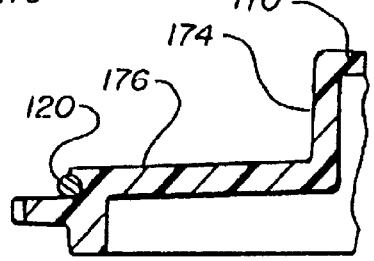
FIG. 9 is a cross-sectional view taken at line 9—9 of FIG. 8.

The equipment interface 86 as best shown in FIGS. 4, 5 and 8, includes a kinematic coupling 90 formed by way of the equipment engagement portion 88. Referencing FIG. 13 which is a cross section through one such structure, the lower surface 220 includes a pair of angled faces 222, 224 defining a groove 225 which would engage partial, spherical surfaces on the equipment, not shown. Alternatively, the interface portion of the central support structure 60 could include said three partial spheres and the cooperating equipment include the grooves formed by angled faces. Alternatively, the equipment interface 86 could include alternate configurations and features to interface with the associated equipment.

Referring to FIGS. 2, 14, 15, 16, and 17, details of the construction and assembly of the removable manual lifting handles 28 are shown. The handle comprises a gripping portion 240 and a shell engagement portion 242. The shell engagement portion 242 utilizes resilient portions 244 with detents 246 and stops 248. The detents 246 have a wedge portion 250 which facilitates installation of the handle into the recesses 78 and rotation under the second engagement structures 254 on the shell 58. The said second engagement structures comprises a pair of inwardly-extending members 255 configured as guide strips which correspond to the extended portion 258 on the handle engagement portion 242 when said handle is in a locked position in said recess 78. In such a locked position, the detents 246 and the stops 248 are at opposite ends of the guide strips 255. The recess 78 is defined by way of a planar portion 262 integral with a circumferential recess wall configured as a ring-shaped portion 264 which is integral with the shell. The guide members 255 are integral with and extend from said ring portion 264. Said configuration allows easy installation simply by placement of the handles 28 into the recesses 78 shown in FIG. 16 with the outwardly-extending portions positioned intermediate the guide members 255 and then rotating in a clockwise direction said handle with the first engagement structure whereby the extending portions 258 including the detent 246 rotate underneath the guide members 255 until the detents 246 snap into place at their seating positions 269 at which point the stops 248 are in their respective seating positions 270.

Significantly, this particular configuration allows easy installation and removal of the handle such as for cleaning or storage or when a robotic application does not require use of the handle. Additionally, the integrity of the separation between the interior of the transport module and the exterior is not affected. In other words, there are no breaks, openings or fasteners through the side walls to accomplish the connection of the handle to said shell.

Figure 18:
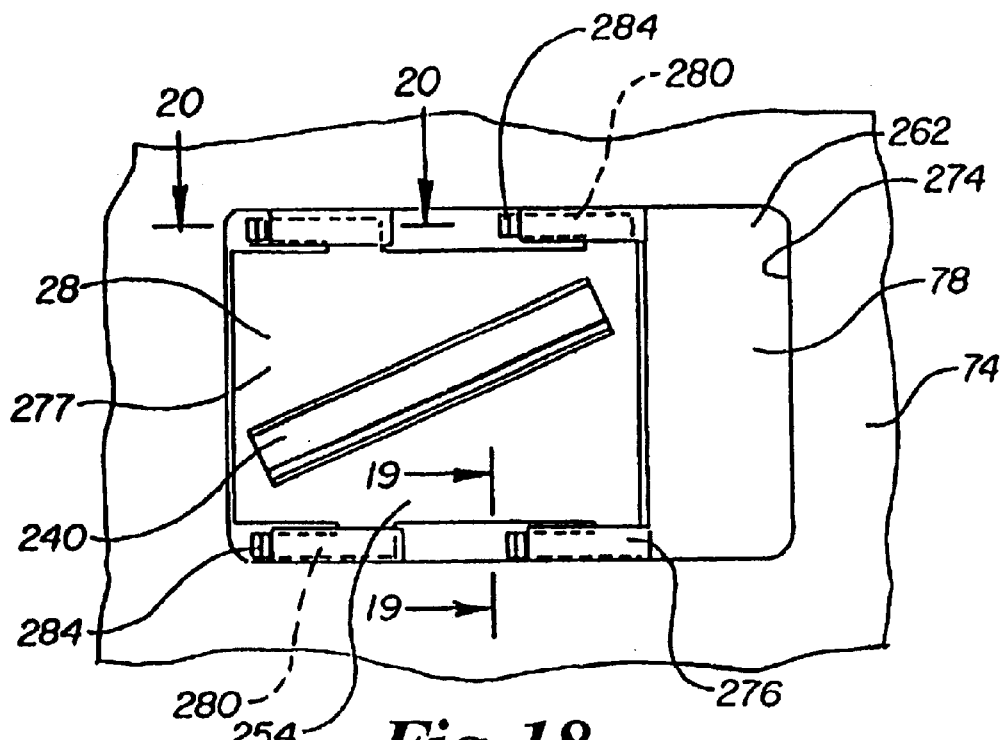
FIG. 18 is an elevational view of an alternative embodiment of the invention focusing on the handle and recess for receiving the handle.

Referring to FIG. 18, engagement structure 275 includes an alternative embodiment of the removable handle 28 shown. This embodiment again utilizes a recess 78 extending inwardly in the side wall 74 with a planar portion 262 at the bottom of said recess. A recess wall or border portion 274 extends around and defines said recess and is integral with the planar portion 262 and the side wall 74. First engagement member 276 configured as four tabs extending inwardly from the recess wall 274. The manual lifting handle 28 comprises a gripping portion 240 and the engagement portion 254 which includes planar portion 277 with resiliently-flexible portions with detents 284. The manual handle 28 is inserted into the recess 78 such that the resilient portions 280 are placed intermediate the tabs 276 and the handle is then slid to the left such that the detents extend under said tabs and slide until they reach their locking position as shown in FIG. 18. Again, this configuration does not breach the integrity of the side wall separating the interior of the transport module from the exterior. Other configurations are also available for utilization of the handle with cooperating engagement members utilizing detents. The use of the detents provides a high level of flexibility in placement and removal of the handles and allows exchange of different sizes of handles, for example, for different operators.

The shell portion of the material is preferably injection molded form polycarbonate or polyetherimide or the like. The central support structure is also ideally integrally injection molded and may be formed from carbon fiber filled PEEK or similar materials, ideally which provide a static dissipative feature. The handles may be injection molded from polycarbonate or polyetherimide. The top second connecting member including the robotic lifting handle may be also formed from carbon fiber filled PEEK or other static dissipative injection molded material.

The mechanisms utilized for latching the doors can be varied and may be such as shown in U.S. Pat. No. 4,995,430 to Anthony C. Bonora et al., U.S Pat. No. 5,915,562 to Nyseth, or similar mechanisms.

Figure 19:
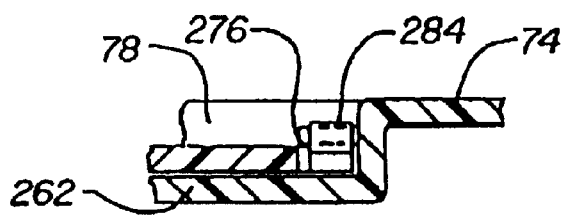
FIG. 19 is a cross-sectional view taken at line 19—19 of FIG. 18.
Figure 20:
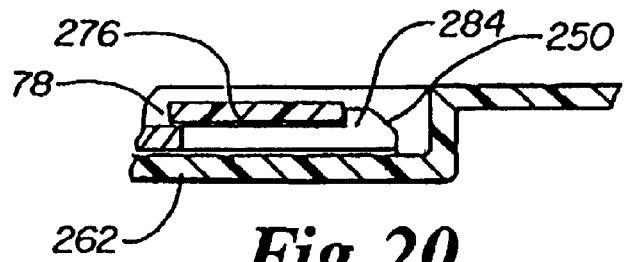
FIG. 20 is a cross-sectional view taken at line 20—20 of FIG. 18.
Figure 23:
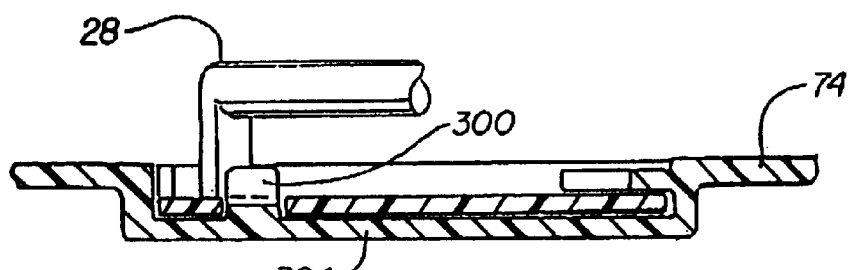
FIG. 23 is a cross-sectional view taken at line 23—23 of FIG. 21.
Figure 21:
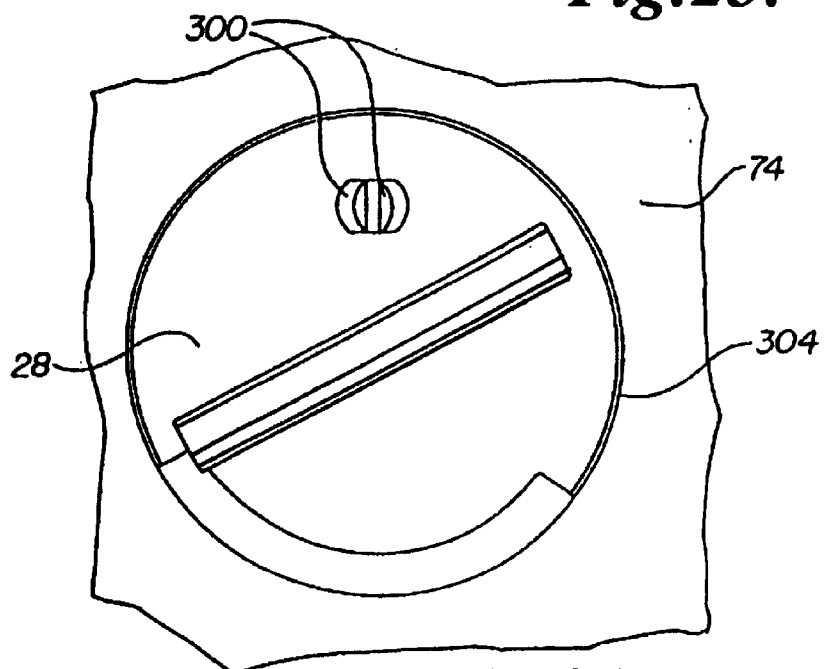
FIG. 21 is a side elevational view of a portion of the module showing an alternative embodiment of the handle.
Figure 24:
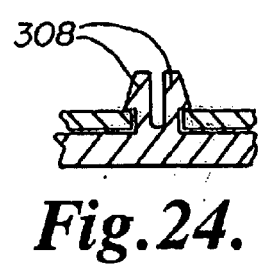
FIG. 24 is a cross-sectional view taken at line 24—24 of FIG. 21.
Figure 22:
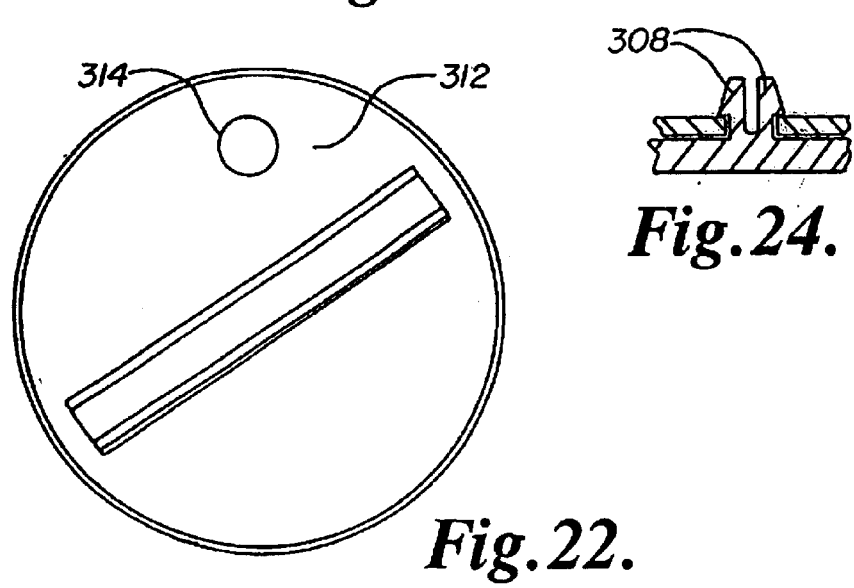
FIG. 22 is a side elevational view of the handle.

Referring to FIGS. 19 and 20, cross-sectional views are taken through the shell and handle member as shown in FIG. 18. Note the detent 284 includes a wedge-shaped portion 250 to aid insertion under the engagement member 276. Referring to FIGS. 21, 22, 23, and 24, various views are shown of an additional embodiment of the handle member and the cooperating engagement structure of the shell. In this particular embodiment the detent members 300 extend normally from the recessed planar portion 304 and thus normally from the side wall of the shell. The detent members generally comprise a pair of angled or wedge-shaped portions 308 sized to fit into a cooperating second engagement member 312 utilizing a circular aperture 314.

The present invention may be embodied in other specific forms without departing from the spirit or essential attributes thereof; and it is, therefore, desired that the present embodiment be considered in all respects as illustrative and not restrictive, reference being made to the appended claims rather than to the foregoing description to indicate the scope of the invention.

We claim:

1. A sealable enclosure of holding a plurality of wafers horizontally, the enclosure comprising:

a container portion with an open front, an open interior and a pair of sides, a plurality of shelves formed of plastic positioned at each side of the container portion for holding the wafers axially aligned in said interior, a door for sealingly closing the open front, the door having a pair of internal latching mechanisms, an outside front surface with a pair of key slots for operating the pair of latching mechanisms, an inside surface with a recess extending centrally from the top of the door to the bottom of the door and positioned intermediate the pair of latching mechanisms, and a wafer restraint positioned on said inside surface in said recess.

2. The sealable enclosure of claim 1 further comprising a machine interface having a kinematic coupling formed of plastic with three grooves, the kinematic coupling integrally connecting to the plurality of shelves formed of plastic on the left side and the plurality of shelves formed of plastic on the right side of the interior of the container portion.

3. The sealable enclosure of claim 2 wherein the integrally connected plurality of shelves and the kinematic coupling are formed of conductive plastic forming an uninterrupted path to ground.

4. The sealable enclosure of claim 1, wherein the front surface has a left side and a right side and wherein one key slot is positioned on the left side and one key slot is positioned on the right side.

5. The sealable enclosure of claim 1, further comprising a pair of handles attached to each of the pair of sides on the outside of the container portion, the handles attached to the sides without utilizing any openings through said right side and said left side of said container portion.

6. The sealable enclosure of claim 1, wherein the wafer restraint is attached exclusively to the door within the recess.

7. The sealable enclosure of claim 1 further comprising a pair of plastic handles, and a left side wall and a right side wall, each having a first engagement structure thereon, each handle having a cooperating second engagement structure slidably engageable and disengageable with one of said first engagement structures whereby each of said handles is placeable and removable from the right and left sides of said module without utilizing any openings in said right and left walls that extend from exterior the transport module to the open interior.

8. The sealable enclosure of claim 7, wherein the second engagement structure is slidably engageable in a substantially linear direction with respect to the first engagement structure.

9. The sealable enclosure of claim 1, further comprising a pair of handles slidingly engageable on the pair of sides of the container portion, each of said handles having a detent thereon to secure said each respective handle to the container portion.

10. The sealable enclosure of claim 9 further comprising a pair of handles and wherein each side of the container portion comprises a handle receiving structure having a downwardly extending flange and an upwardly extending flange for slidably receiving and constraining one of the respective handles, said one of said respective handles slidable in a horizontal direction into said receiving structure.

11. The sealable enclosure of claim 10 wherein each handle further comprises an integral detent for securing the handle into the receiving structure.

12. The sealable enclosure of claim 1, wherein the outside front surface is planar.

13. A sealable enclosure of holding a plurality of wafers horizontally, the enclosure comprising:

a container portion with an open front, an open interior and a pair of sides, a plurality of shelves formed of plastic positioned at each side of the container portion for holding the wafers axially aligned in said interior, a door for sealingly closing the open front, the door having a pair of internal latching mechanisms, an outside front surface with a pair of key slots for operating the pair of latching mechanisms, an inside surface with a recess extending centrally from the top of the door to the bottom of the door, and a wafer restraint positioned on said inside surface in said recess.

14. The sealable enclosure of claim 13, wherein the outside front surface is planar.

15. The sealable enclosure of claim 13, further comprising an additional wafer restraint positioned on said inside surface in said recess.

16. A sealable enclosure for holding wafers, comprising a container portion with an open front and a plurality of shelves for holding wafers horizontally, a closed left side wall, and a closed right side wall, a door sized to close the open front, and a pair of plastic handles, the left side wall and the right side wall each having a first engagement structure thereon and integral with said respective side wall, each plastic handle having a cooperating second engagement structure integral with said handle and including an integral plastic detent whereby said second engagement structures are removably engageable with one of said engagement structures whereby each of said handles is slidably attachable on and removable from the respective right and left side walls without utilizing separate fasteners for securing the handles onto the right side wall and left side wall.

17. A sealable enclosure of holding a plurality of wafers horizontally, the enclosure comprising:

a container portion with an open front, an open interior and a pair of sides, a plurality of shelves formed of plastic positioned at each side of the container portion for holding the wafers axially aligned in said interior, a machine interface having a kinematic coupling formed of plastic with three grooves, the kinematic coupling integrally connecting to the plurality of shelves formed of plastic at each side of the interior of the container portion;

a door for sealingly closing the open front, the door having a plurality of latches that extend and retract.

18. The sealable enclosure of claim 17 wherein the door has a pair of internal latching mechanisms, an outside front surface with a pair of key slots for operating the pair of latching mechanisms.

19. The sealable enclosure of claim 17, wherein the door has an inside surface with a recess extending centrally from the top of the door to the bottom of the door, and further comprises a wafer restraint positioned on said inside surface in said recess.

20. The sealable enclosure of claim 17, wherein the plastic comprising the wafer shelves integral with the kinematic coupling is formed of static dissipative plastic whereby an uninterrupted path-to-ground through the kinematic coupling is formed.

21. A sealable enclosure for holding a plurality of wafers horizontally, the enclosure comprising:

a container portion with an open front, an open interior and a pair of sides, a plurality of shelves formed of plastic positioned at each side of the container portion for holding the wafers axially aligned in said interior, a pair of handles attached to the container portion at the sides, a door for sealingly closing the open front, an inside surface with a recess extending centrally from the top of the door to the bottom of the door, and a wafer restraint positioned on said inside surface in said recess for engaging the wafers.

* * * * *